United States Patent
Takizawa et al.

(10) Patent No.: US 8,901,602 B2
(45) Date of Patent: Dec. 2, 2014

(54) POWER SEMICONDUCTOR DEVICE AND POWER CONVERSION SYSTEM USING THE DEVICE

(75) Inventors: Satoki Takizawa, Hino (JP); Makoto Yatsu, Akiruno (JP)

(73) Assignee: Fuji Electric Co., Ltd. (JP)

( * ) Notice: Subject to any disclaimer, the term of this patent is extended or adjusted under 35 U.S.C. 154(b) by 834 days.

(21) Appl. No.: 13/042,999

(22) Filed: Mar. 8, 2011

(65) Prior Publication Data

US 2011/0242860 A1    Oct. 6, 2011

(30) Foreign Application Priority Data

Apr. 6, 2010    (JP) ................................. 2010-087471

(51) Int. Cl.
*H01L 29/739*    (2006.01)
*H01L 25/07*    (2006.01)
*H01L 23/64*    (2006.01)
*H02M 7/00*    (2006.01)

(52) U.S. Cl.
CPC .............. *H01L 25/07* (2013.01); *H01L 23/645* (2013.01); *H02M 7/003* (2013.01); *H01L 2924/0002* (2013.01)
USPC ....................................................... 257/140

(58) Field of Classification Search
CPC .............................. H01L 23/645; H01L 25/07
USPC .......................................... 257/140, E29.197
See application file for complete search history.

(56) References Cited

U.S. PATENT DOCUMENTS

| | | | |
|---|---|---|---|
| 5,953,222 A | 9/1999 | Mizutani | |
| 6,646,898 B2 | 11/2003 | Furukawa et al. | |
| 7,289,329 B2 * | 10/2007 | Chen et al. | 257/706 |
| 2002/0024129 A1 | 2/2002 | Hirahara et al. | |
| 2010/0039843 A1 | 2/2010 | Takizawa | |
| 2012/0018777 A1 * | 1/2012 | Takizawa | 257/140 |
| 2012/0119256 A1 * | 5/2012 | Okita | 257/140 |

FOREIGN PATENT DOCUMENTS

| | | |
|---|---|---|
| CN | 1173068 A | 2/1998 |
| CN | 1242604 A | 1/2000 |
| CN | 1333566 A | 1/2002 |
| JP | 2000-216331 A | 8/2000 |
| JP | 2002-231883 A | 8/2002 |
| JP | 2008-193779 A | 8/2008 |

OTHER PUBLICATIONS

"FUJI Power Semiconductors IGBT Modules" by Fuji Electric Device Technology Co., Ltd., Mar. 2010, PMJ01e.

(Continued)

*Primary Examiner* — Cuong Q Nguyen
(74) *Attorney, Agent, or Firm* — Rossi, Kimms & McDowell LLP (57) ABSTRACT

In some aspects of the invention, a power semiconductor module is applied to a multi-level converter circuit with three or more levels of voltage waveform. A first IGBT, a diode whose cathode is connected to the emitter of the first IGBT, and a second IGBT having reverse blocking voltage whose emitter is connected to the emitter of the first IGBT, are housed in one package, and each of the collector of the first IGBT, the collector of the second IGBT, the connection point of the emitter of the first IGBT and the emitter of the second IGBT, and the anode of the diode, is an external terminal.

2 Claims, 12 Drawing Sheets

(56) References Cited

OTHER PUBLICATIONS

Takizawa Satoki et al.. "Power Semiconductor Device and Power Conversion System using the Device," Specification and Drawings of unpublished related co-pending U.S. Appl. No. 13/043,012, filed Mar. 8, 2011, pp. 1-54.

Chinese Office Action for corresponding CN 201110051651.X, dated May 6, 2014. English translation provided.

* cited by examiner

POWER SEMICONDUCTOR DEVICE AND POWER CONVERSION SYSTEM USING THE DEVICE

BACKGROUND OF THE INVENTION

1. Technical Field

The present invention relates to a power semiconductor device or module applied to a multi-level power conversion system of three levels or more, and to a power conversion system to which the module is applied.

2. Related Art

Figure 11:
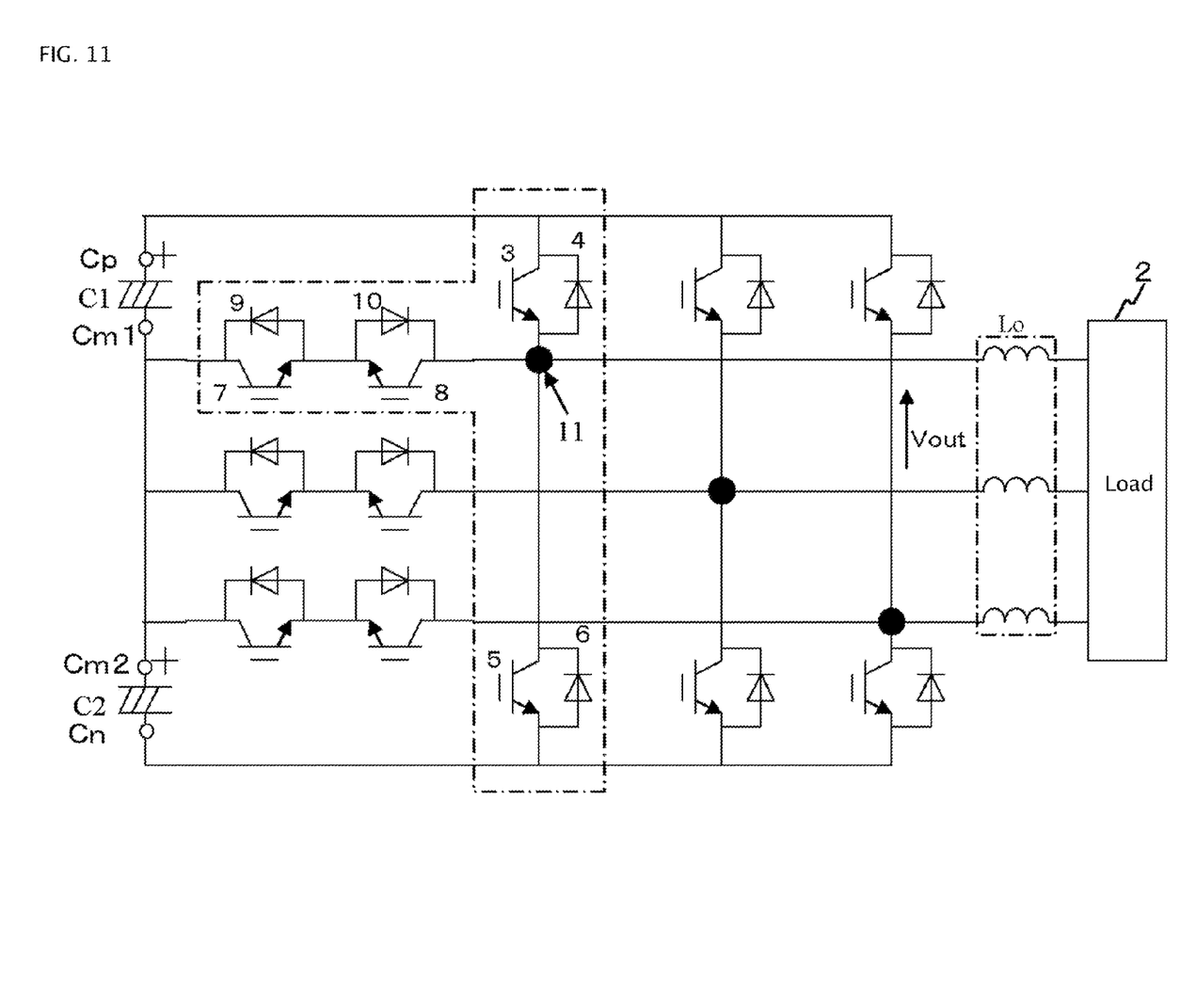
FIG. 11 shows a main circuit configuration diagram of a three level inverter.

FIG. 11 shows an example of a circuit of a three level inverter, which is a power conversion circuit that converts from a direct current to an alternating current. In a direct current power source in which C1 and C2 are connected in series (a large capacity capacitor may be used instead), a positive side potential is Cp, a negative side potential is Cn, and intermediate point potentials are Cm (Cm1 and Cm2). Generally, when the direct current power source is configured from an alternating current power source system, it is possible to configure by applying a rectifier, a large capacity electrolytic capacitor, or the like.

Figure 13:
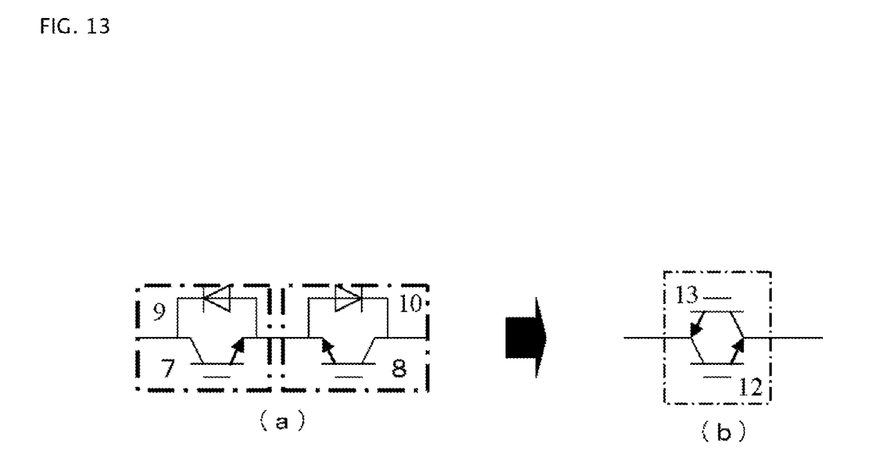
FIGS. 13A and 13B are examples of a configuration of a bidirectional switch.

Reference numerals 3 and 4 are an IGBT and diode of an upper arm connected to the positive side potential Cp, reference numerals 5 and 6 are an IGBT and diode of a lower arm connected to the negative side potential Cn, and the upper arm and lower arm are connected in series, configuring a one phase arm. A three phase circuit is configured of three phase arms. Also, reference numerals 7, 8, 9, and 10 are elements configuring a bidirectional switch connected between the direct current power supply intermediate point potential Cm (Cm1 and Cm2) and an alternating current output terminal 11, wherein 7 and 8 are IGBTs, and 9 and 10 are diodes. The bidirectional switch shown in FIG. 11 is of a configuration wherein IGBTs to which a diode is reverse parallel connected are connected in reverse series, and is applied to each phase. In the drawing, the IGBT 7 and IGBT 8 are connected in reverse series with a common emitter, but the switch can also be realized with a common collector configuration or, as shown in FIG. 13B, with a configuration wherein IGBTs 12 and 13 having reverse blocking voltage are reverse parallel connected.

Figure 12:
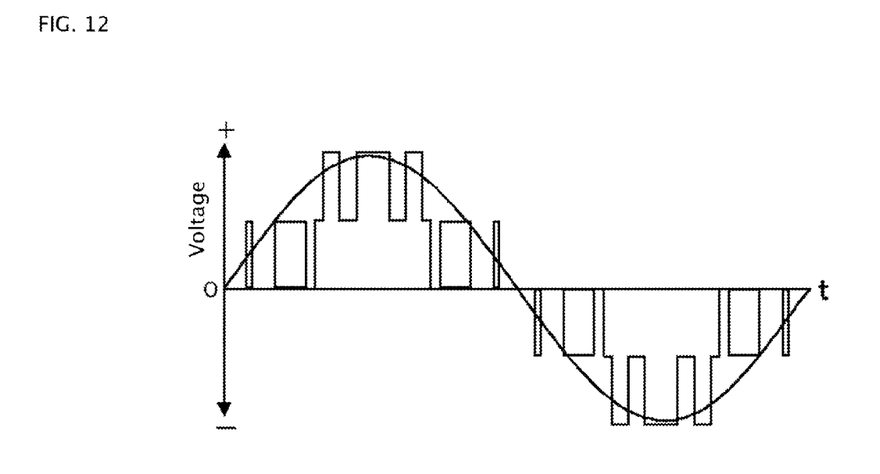
FIG. 12 shows an example of a three level inverter output voltage waveform.

Lo is a filter reactor, and 2 is a load of the system. By adopting this circuit configuration, it is possible to output the direct current power source positive side potential Cp, negative side potential Cn, and intermediate point potential Cm, to the output terminal 11. That is, the circuit is a three level inverter circuit that outputs three levels of voltage waveform. FIG. 12 shows an example of an output voltage (Vout) waveform. A characteristic being that there are less low order harmonic components (close to a sinusoidal waveform) than with a two level inverter, it is possible to miniaturize the output filter reactor Lo.

Figure 14:
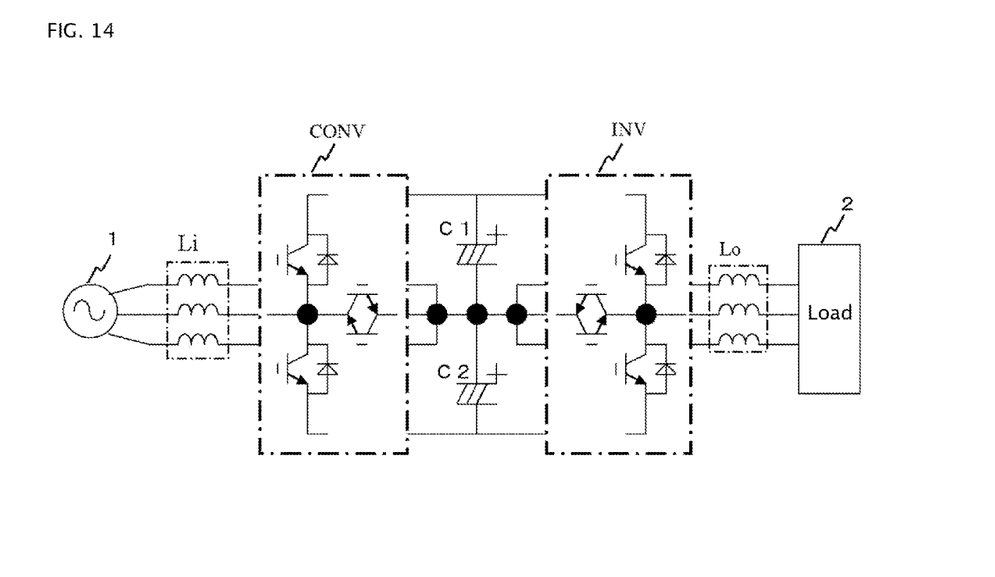
FIG. 14 is a main circuit configuration diagram of a double converter (converter+inverter)

Also, FIG. 14 shows a double converter type of power conversion system configured of a PWM converter (CONV) that converts alternating current to direct current and a PWM inverter (INV) that converts direct current to alternating current. A configuration is such that, with a three phase alternating current power source 1 as an input, a stable alternating current voltage is generated by an input filter reactor Li, the three phase three level PWM converter CONV, large capacity capacitors C1 and C2 connected in series, the three phase three level PWM inverter INV, and an output filter Lo, and alternating current power is supplied to a load 2.

Figure 15A:
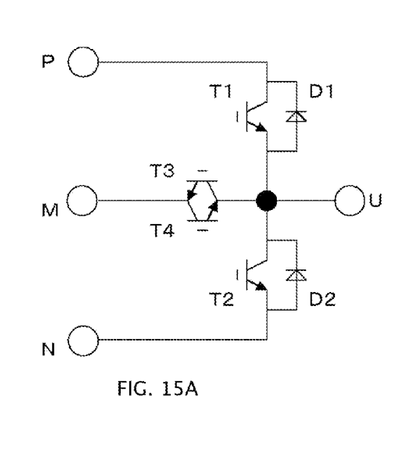
FIGS. 15A and 15B are an example of a heretofore known three level converter circuit module.
Figure 15B:
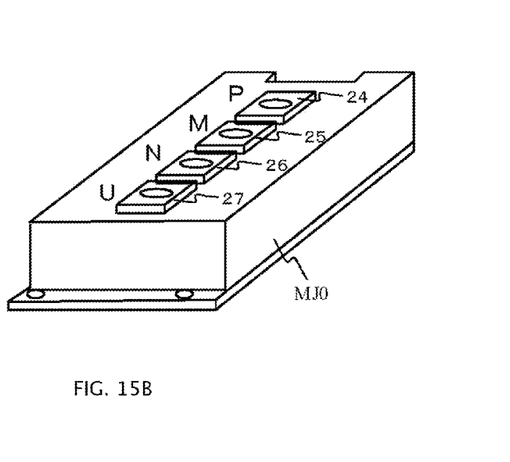

An example of a case of configuring the three level converter (converter or inverter) with a dedicated IGBT module is shown in Japanese Patent Publication No. JP-A-2008-193779. FIG. 15B shows an external structural view of the module, and FIG. 15A shows an example of an internal circuit. Reference numerals 24, 25, 26, and 27 are, respectively, a terminal P connected to the potential Cp, a terminal M connected to the potential Cm, a terminal N connected to the potential Cn, and an alternating current output terminal U. It is possible to configure a three phase inverter by using three of this module, and when seeking a still larger capacity, this can be realized by connecting the modules in parallel.

Figure 16:
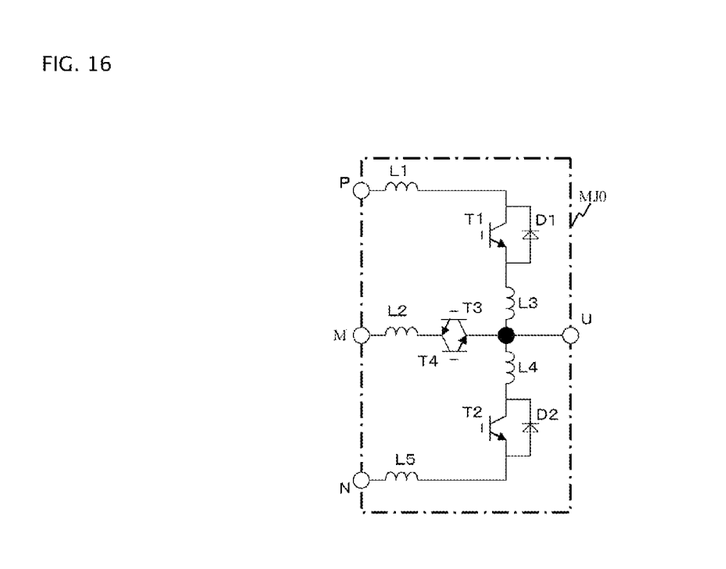
FIG. 16 is an internal equivalent circuit diagram of the heretofore known three level converter circuit module.

FIG. 16 shows an equivalent circuit described focusing on internal wire inductors (L1 to L5) of the module of FIGS. 15A and 15B. Each inductor is mainly formed by the wires between the module output terminal and semiconductor chips and between the semiconductor chips. As each wire is normally of around a few centimeters, each inductance value is around 10 nH.

Figure 17:
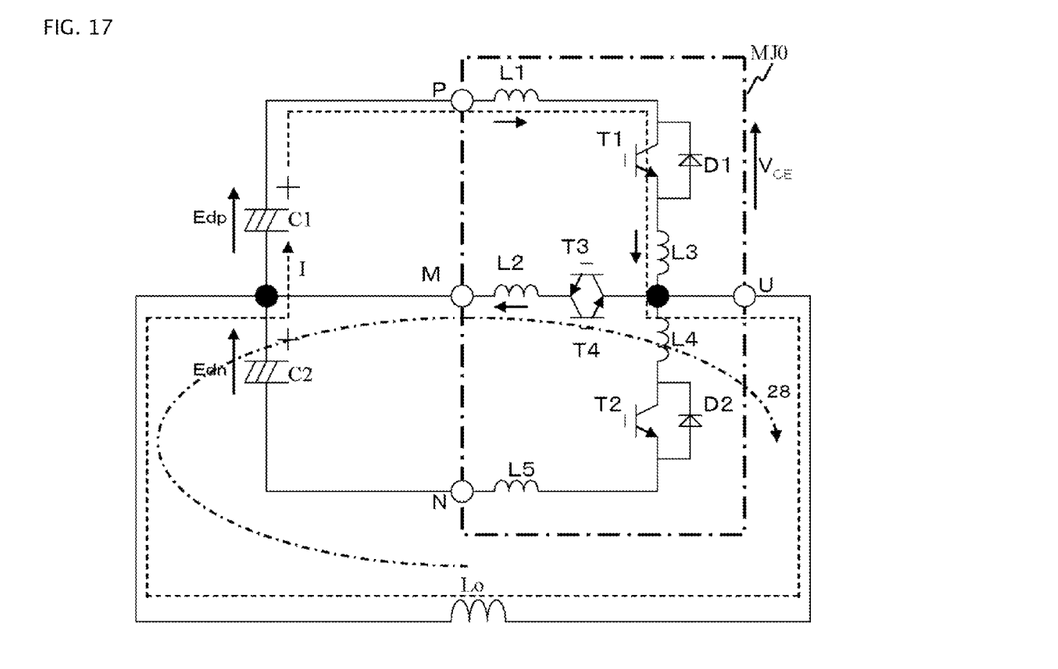
FIG. 17 is a circuit diagram for illustrating a heretofore known problem.

FIG. 17 is a circuit diagram for illustrating the problem. In FIG. 17, when an IGBT T1 is in an on condition, a current I flows along the path (a path passing from a capacitor C1, through an inductor L1, the IGBT T1, and an inductor L3, to a reactor Lo) shown by the dotted line. Next, on the IGBT T1 being turned off, an IGBT T4 turned on in advance has continuity, and the current of the reactor Lo is transferred to a current path 28 passing from the reactor Lo, through an inductor L2 and the IGBT T4, to the reactor Lo. At this time, a voltage is transiently generated in the directions of the arrows in the drawing in the inductors L1, L2, and L3, in accordance with an IGBT current change rate (di/dt).

Figure 18:
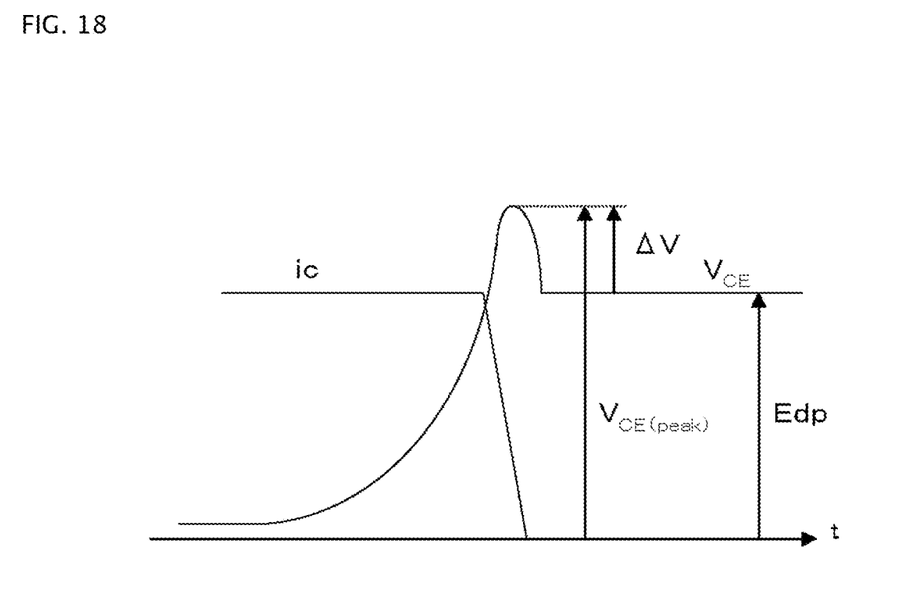
FIG. 18 is an example of current and voltage waveforms when an IGBT is turned off.

As a result, when ignoring a wire inductance of external wires, a maximum of the voltage shown in Equation 1 (shown below) is applied between the collector and emitter of the IGBT T1. FIG. 18 shows waveforms of a collector current (ic) and a voltage between the collector and emitter ($V_{CE}$) when the IGBT T1 is turned off.

$$V_{CE(peak)}=Edp+(L1+L2+L3)\cdot di/dt \quad \text{Equation 1}$$

$$\text{Surge voltage } \Delta V=(L1+L2+L3)\cdot di/dt \quad \text{Equation 2}$$

Where:
Edp: direct current power source 1 direct current voltage
di/dt: IGBT current change rate when IGBT is turned off
L1+L2+L3: wire inductance value As one example, in the case of an IGBT in the 100 ampere class, as the di/dt thereof is a maximum of around 2,000 A/μs, when L1+L2+L3=30 nH, the surge amount (L1+L2+L3)·di/dt according to Equation 1 is 60V.

Consequently, due to the existence of L1, L2, L3, L4, and L5, the value of the peak voltage applied to the IGBT when the IGBT is turned off increases with respect to the direct current voltage Edp by the amount of the surge voltage in Equation 2, meaning that the IGBT chip and the chip connected in parallel thereto need to be ones with a high voltage rating. Normally, a chip with a high voltage rating is such that the chip area increases roughly in proportion to the voltage rating, meaning that the module increases in size, and the cost increases.

In particular, when seeking an increase in module current (an increase in capacity), the volume of the module increases, meaning that the length of wiring in the module inevitably increases, as a result of which the wire inductance value also increases. Also, as the di/dt when switching also increases in approximate proportion to the current value, the surge voltage ΔV according to Equation 2 increases exponentially with respect to an increase in the current rating of the module. For this reason, a limit arises in the achieving of an increase in capacity in one module. Meanwhile, although an increasing of capacity is routinely carried out by connecting modules in parallel, it is necessary to consider the increase in cost compared with the case of configuring with one module, and the imbalance in current between the parallel connections, meaning that there is a problem in that the parallel connection has to be derated during design.

SUMMARY OF THE INVENTION

In order to solve the heretofore described problems, according to a first aspect of the invention, with a power semiconductor module such as an IGBT applied to a multi-level converter circuit with three or more levels of voltage waveform, a first IGBT, a diode whose cathode is connected to the emitter of the first IGBT, and a second IGBT having reverse blocking voltage whose emitter is connected to the emitter of the first IGBT, are housed in one package, and each of the collector of the first IGBT, the collector of the second IGBT, the connection point of the emitter of the first IGBT and the emitter of the second IGBT, and the anode of the diode, is an external terminal.

According to a second aspect of the invention, with the power semiconductor module according to the first aspect of the invention, the collector of the first IGBT is a terminal P connected to the positive electrode of a direct current power source, the collector of the second IGBT is a terminal M connected to an intermediate point of the direct current power source, the connection point of the emitter of the first IGBT and the emitter of the second IGBT is an output terminal U, the anode of the diode is a terminal N connected to the negative electrode of the direct current power source, and the terminal array is disposed in a linear form in the order of the terminal P, the terminal M, the terminal N, and the terminal U.

According to a third aspect of the invention, with a power semiconductor module such as an IGBT applied to a multi-level converter circuit with three or more levels of voltage waveform, a first IGBT, a diode whose anode is connected to the collector of the first IGBT, and a second IGBT having reverse blocking voltage whose collector is connected to the collector of the first IGBT, are housed in one package, and each of the emitter of the first IGBT, the emitter of the second IGBT, the connection point of the collector of the first IGBT and the collector of the second IGBT, and the cathode of the diode, is an external terminal.

According to a fourth aspect of the invention, with the power semiconductor module according to the third aspect of the invention, the emitter of the first IGBT is a terminal N connected to the negative electrode of a direct current power source, the emitter of the second IGBT is a terminal M connected to an intermediate point of the direct current power source, the connection point of the collector of the first IGBT and the collector of the second IGBT is an output terminal U, the cathode of the diode is a terminal P connected to the positive electrode of the direct current power source, and the terminal array is disposed in a linear form in the order of the terminal P, the terminal M, the terminal N, and the terminal U.

According to a fifth aspect of the invention, with a power semiconductor module such as an IGBT applied to a multi-level converter circuit with three or more levels of voltage waveform, a first IGBT, a first diode whose cathode is connected to the emitter of the first IGBT, and a series circuit of a second diode and a second IGBT of which one end is connected to the emitter of the first IGBT, are housed in one package, and each of the collector of the first IGBT, the other end of the series circuit, the connection point of the emitter of the first IGBT and the one end of the series circuit, and the anode of the first diode, is an external terminal.

According to a sixth aspect of the invention, with the power semiconductor module according to the fifth aspect of the invention, the collector of the first IGBT is a terminal P connected to the positive electrode of a direct current power source, the other end of the series circuit is a terminal M connected to an intermediate point of the direct current power source, the connection point of the emitter of the first IGBT and the one end of the series circuit is an output terminal U, the anode of the first diode is a terminal N connected to the negative electrode of the direct current power source, and the terminal array is disposed in a linear form in the order of the terminal P, the terminal M, the terminal N, and the terminal U.

According to a seventh aspect of the invention, with a power semiconductor module such as an IGBT applied to a multi-level converter circuit with three or more levels of voltage waveform, a first IGBT, a first diode whose anode is connected to the collector of the first IGBT, and a series circuit of a second diode and a second IGBT of which one end is connected to the collector of the first IGBT, are housed in one package, and each of the emitter of the first IGBT, the other end of the series circuit, the connection point of the emitter of the first IGBT and the series circuit, and the cathode of the first diode, is an external terminal.

According to an eighth aspect of the invention, with the power semiconductor module according to the seventh aspect of the invention, the emitter of the first IGBT is a terminal N connected to the negative electrode of a direct current power source, the other end of the series circuit is a terminal M connected to an intermediate point of the direct current power source, the connection point of the collector of the first IGBT and the one end of the series circuit is an output terminal U, the cathode of the first diode is a terminal P connected to the positive electrode of the direct current power source, and the terminal array is disposed in a linear form in the order of the terminal P, the terminal M, the terminal N, and the terminal U.

According to a ninth aspect of the invention, in a multi-level power converter circuit with three or more levels of voltage waveform, the terminal array of the power semiconductor module according to the second aspect of the invention and the terminal array of the power semiconductor module according to the fourth aspect of the invention become parallel to each other by the two power semiconductor modules being disposed adjacent.

According to a tenth aspect of the invention, in a multi-level power converter circuit with three or more levels of voltage waveform, the terminal array of the power semiconductor module according to the sixth aspect of the invention and the terminal array of the power semiconductor module according to the eighth aspect of the invention become parallel to each other by the two power semiconductor modules being disposed adjacent.

According to the invention, it is possible with a power semiconductor module used in a multi-level converter circuit of three levels or more to transfer current without passing through an external wire by configuring the chips inside the module with a circuit focused on a commutation action. As a result of this, it is possible to make the current rating approximately twice as large in comparison with a heretofore known module with the same volume, with hardly any change in the value of the wire inductance inside the module, and it is possible to curb a cost increase even when there is an increase in capacity.

Also, by applying the modules of the invention to a power conversion system that converts from an alternating current to a direct current, or from a direct current to an alternating current, it is possible to reduce the surge voltage when switching. Furthermore, when applying the modules in a multiple parallel connection, it is possible to reduce current derating when designing. As a result of this, small, low-priced power semiconductor modules, a reduction in the number of wires in a conversion system, a miniaturization of the system, and a reduction in cost, are possible.

DETAILED DESCRIPTION OF CERTAIN EMBODIMENTS

Aspects of the invention are directed to configuring one phase of a converter circuit of three levels or more by combining two kinds of power semiconductor module incorporating one of the upper and lower arm IGBTs, the other diode and one of the elements configuring the bidirectional switch as power semiconductor modules configuring one phase of a converter circuit of three levels or more wherein a bidirectional switch is connected between a series connection point of an upper and lower arm IGBT series circuit and a direct current power source intermediate point.

WORKING EXAMPLE 1

Figure 1:
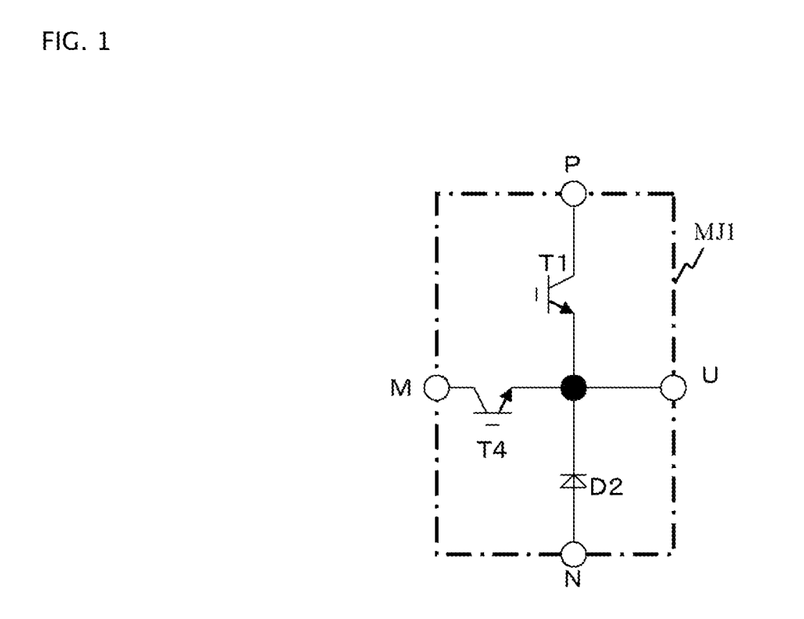
FIG. 1 is a circuit configuration diagram showing a first working example of the invention.
Figure 2:
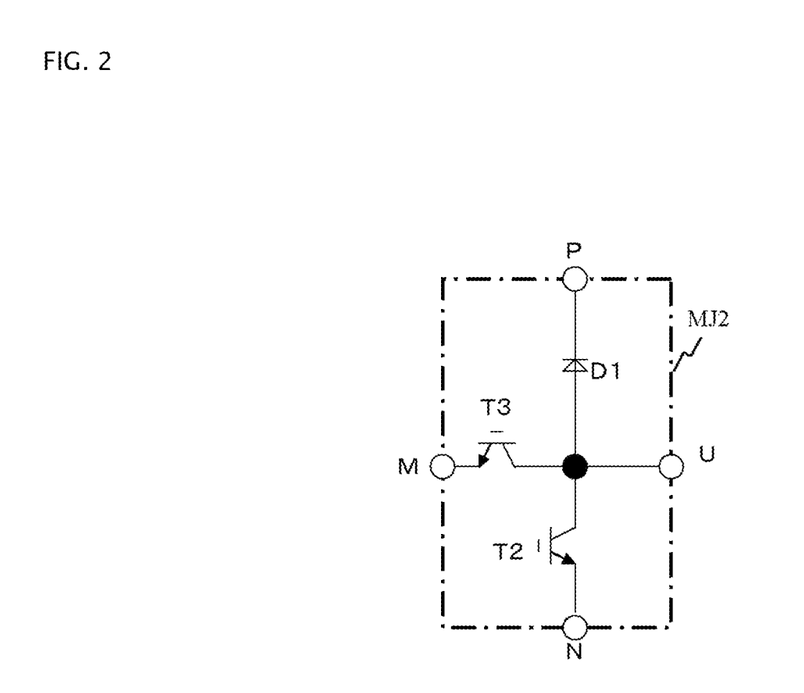
FIG. 2 is a circuit configuration diagram showing a second working example of the invention.
Figure 5:
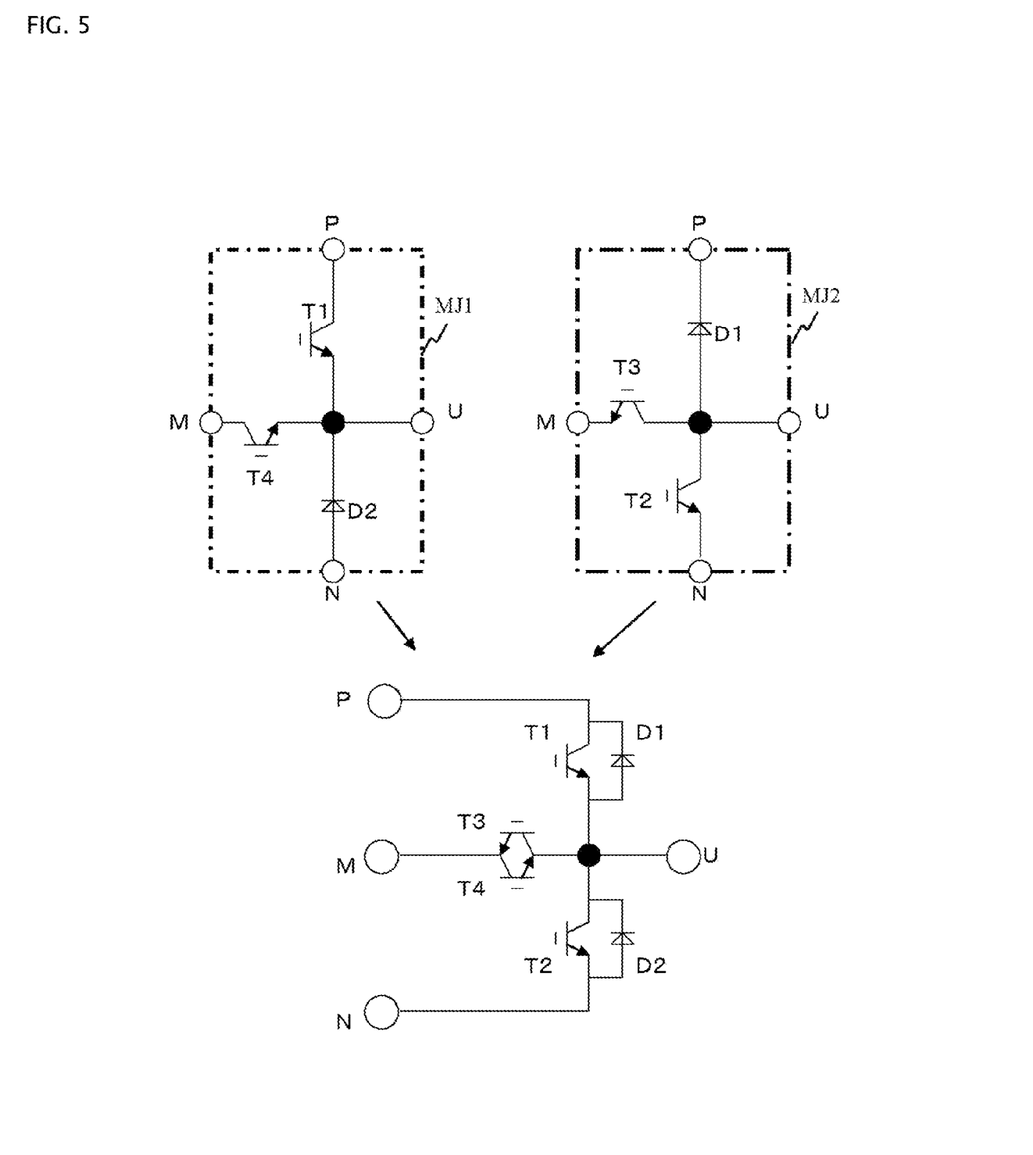
FIG. 5 is a circuit configuration diagram of one phase of a three level converter circuit.

FIGS. 1 and 2 show a first working example of the invention. FIGS. 1 and 2 corresponding to first and second aspects of the invention and third and fourth aspects of the invention respectively, a semiconductor element connected to a potential Cm of a direct current power source is an IGBT having reverse blocking voltage, and the shape of the module is the external structure shown in FIG. 6. FIGS. 5 and 7 are a working example when the modules are applied to a three level inverter (a converter from a direct current to an alternating current).

A module MJ1 of FIG. 1, incorporating an IGBT T1 whose collector is connected to the positive electrode of a direct current power source, a diode D2 whose anode is connected to the negative electrode of the direct current power source, and a bidirectional switch reverse blocking type IGBT T4, is of a configuration wherein the IGBT T1 collector is connected to a terminal P, the reverse blocking type IGBT T4 collector to a terminal M, and a connection point of the reverse blocking type IGBT T4 emitter, IGBT T1 emitter, and diode D2 to a terminal U.

A module MJ2 of FIG. 2, incorporating an IGBT T2 whose emitter is connected to the negative electrode of a direct current power source, a diode D1 whose cathode is connected to the positive electrode of the direct current power source, and a bidirectional switch reverse blocking type IGBT T3, is of a configuration wherein the IGBT T2 emitter is connected to a terminal N, the reverse blocking type IGBT T3 emitter to a terminal M, and a connection point of the IGBT T2 collector, reverse blocking type IGBT T3 collector, and diode D1 anode to a terminal U.

FIG. 5 shows a circuit diagram wherein a circuit of one phase of a three level inverter is configured using the modules MJ1 and MJ2. The circuit of one phase of the three level inverter is configured by connecting the terminals P, the terminals N, and the terminals U of each module together.

Figure 6:
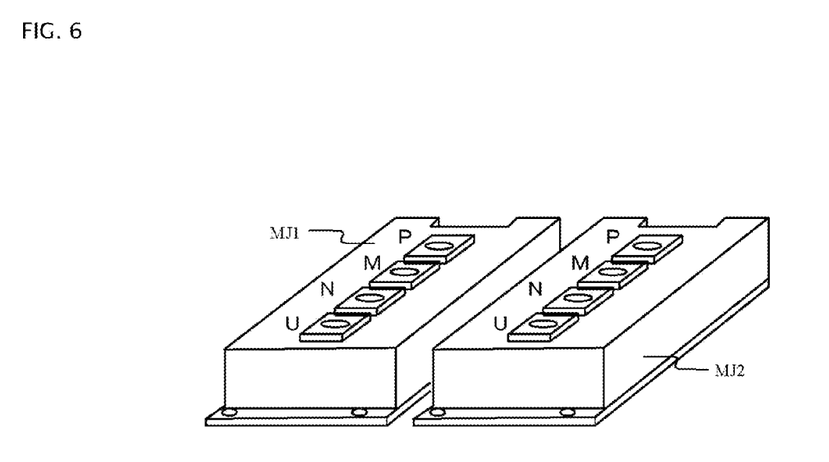
FIG. 6 is an example of a three level converter circuit module.
Figure 7:
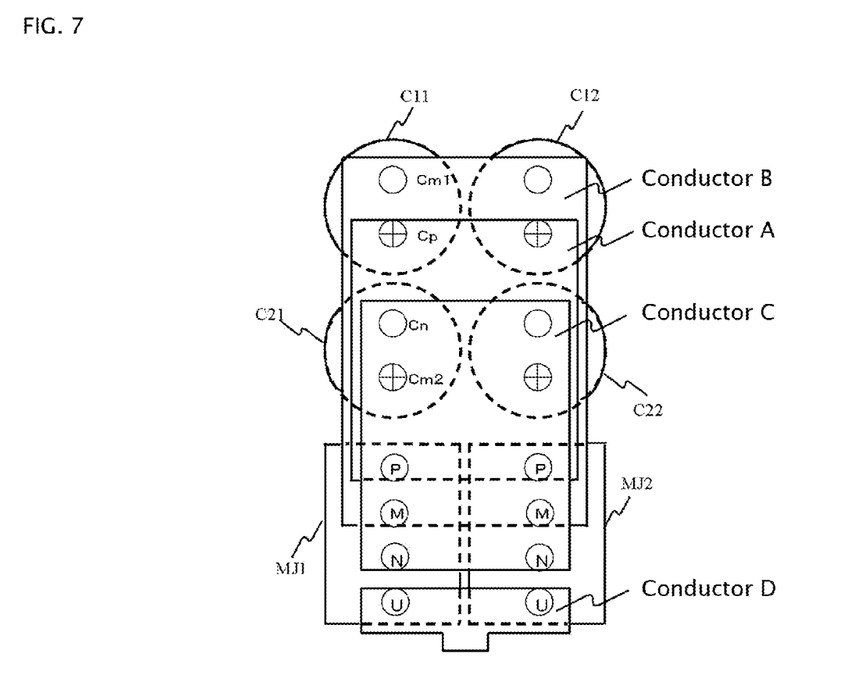
FIG. 7 shows a wiring structure example of modules and capacitors (one phase)

FIG. 6 shows an external view of the modules MJ1 and MJ2. Also, FIG. 7 shows an example of a structural view wherein the modules MJ1 and MJ2 are wired by conductors to a capacitor series circuit serving as a direct current power source. Capacitors C11 and C12, and capacitors C21 and C22, are connected in parallel, and further connected in series, configuring the direct current power source.

The modules are disposed adjacent so that the terminal arrays of the modules are parallel to each other, the terminal P of each module and positive side potentials Cp of the parallel connected capacitors C11 and C12 are connected by a conductor A, the terminal M of each module, intermediate point potentials Cm1 of the parallel connected capacitors C11 and C12, and intermediate point potentials Cm2 of the capacitors C21 and C22 by a conductor B, and the terminal N of each module and negative side potentials Cn of the parallel connected capacitors C21 and C22 by a conductor C.

Also, the terminal U of each module is connected by a conductor D, forming an alternating current terminal.

By disposing the modules MJ1 and MJ2 adjacent so that the terminal arrays are parallel to each other, as heretofore described, it is possible to bring the terminals P, M, N, and U of each module close together. As a result of this, it is easily possible to realize to adopt a parallel flat plate structure, with an object of shortening the wiring between the capacitors and modules, as shown in FIG. 7, and reducing the wire inductance.

By using three of this configuration, it is possible to configure a three phase three level inverter or three phase three level converter.

Figure 8A:
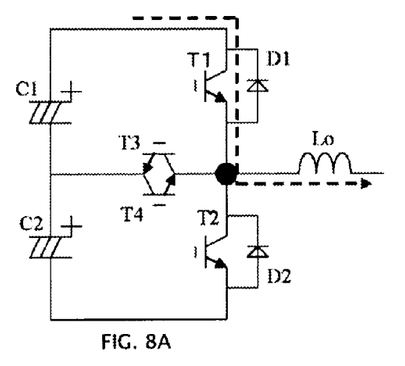
FIGS. 8A to 8C are action illustrations showing a first commutation action of a current while an inverter is in operation.
Figure 8B:
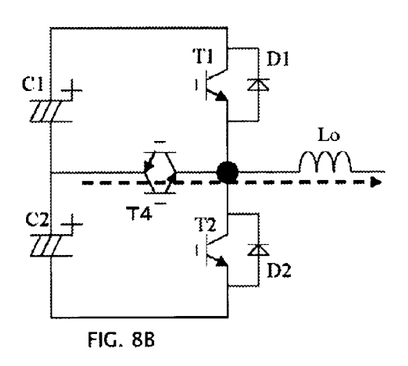
Figure 8C:
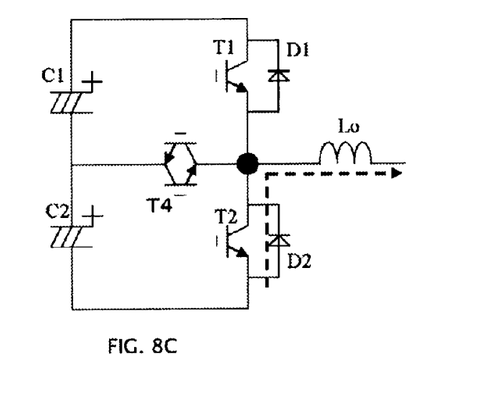

FIGS. 8A to 8C show an example of a commutation action mode 1 of the current while the inverter is in operation. This is an action when the current flows from the direct current power source to the load side (reactor Lo side). When the IGBT T1 is turned off from the condition of FIG. 8A, the current is transferred to the IGBT T4 side, as shown in FIG.

8B. Also, when the IGBT T1 is turned on from the condition of FIG. 8B, the current is transferred to the IGBT T1 side, as shown in FIG. 8A.

Meanwhile, when the IGBT T4 is turned off from the condition of FIG. 8B, the current is transferred to the diode D2 side, as shown in FIG. 8C. Also, when the IGBT T4 is turned on from the condition of FIG. 8C, the current is transferred to the IGBT T4 side, as shown in FIG. 8B.

Figure 9A:
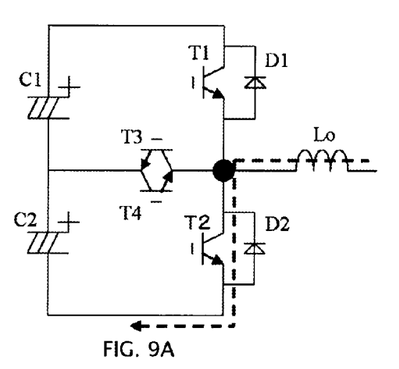
FIGS. 9A to 9C are action illustrations showing a second commutation action of the current while the inverter is in operation.
Figure 9B:
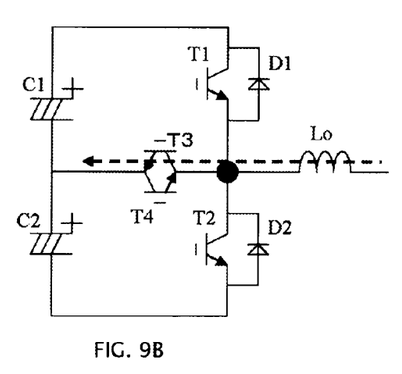
Figure 9C:
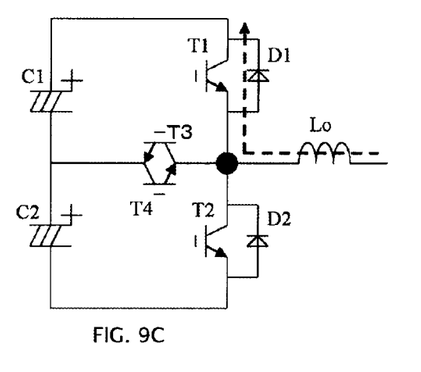

FIGS. 9A to 9C show an example of a commutation action mode 2 of the current while the inverter is in operation. This is an action when the current flows from the load side (reactor Lo side) to the direct current power source. When the IGBT T2 is turned off from the condition of FIG. 9A, the current is transferred to the IGBT T3 side, as shown in FIG. 9B. Also, when the IGBT T2 is turned on from the condition of FIG. 9B, the current is transferred to the IGBT T2 side, as shown in FIG. 9A.

Meanwhile, when the IGBT T3 is turned off from the condition of FIG. 9B, the current is transferred to the diode D1 side, as shown in FIG. 9C. Also, when the IGBT T3 is turned on from the condition of FIG. 9C, the current is transferred to the IGBT T3 side, as shown in FIG. 9B.

As heretofore described, as the IGBT T1, T4, or diode D2 has continuity with the output current polarity shown in FIGS. 8A to 8C, in the case of the module MJ1 of FIG. 1, it is possible for the current to transfer without passing through an external wire. Also, as the IGBT T2, T3, or diode D1 has continuity with the output current polarity shown in FIGS. 9A to 9C, in the case of the module MJ2 of FIG. 2, it is possible for the current to transfer without passing through an external wire.

WORKING EXAMPLE 2

Figure 3:
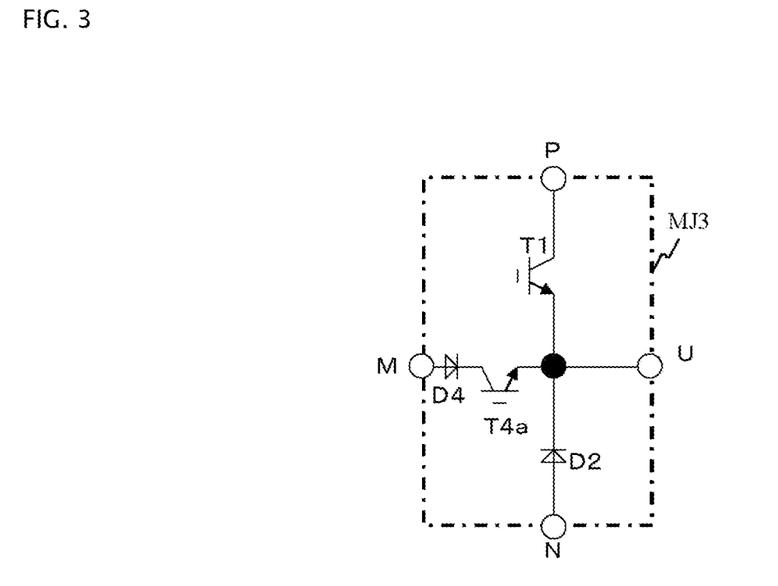
FIG. 3 is a circuit configuration diagram showing a third working example of the invention.
Figure 4:
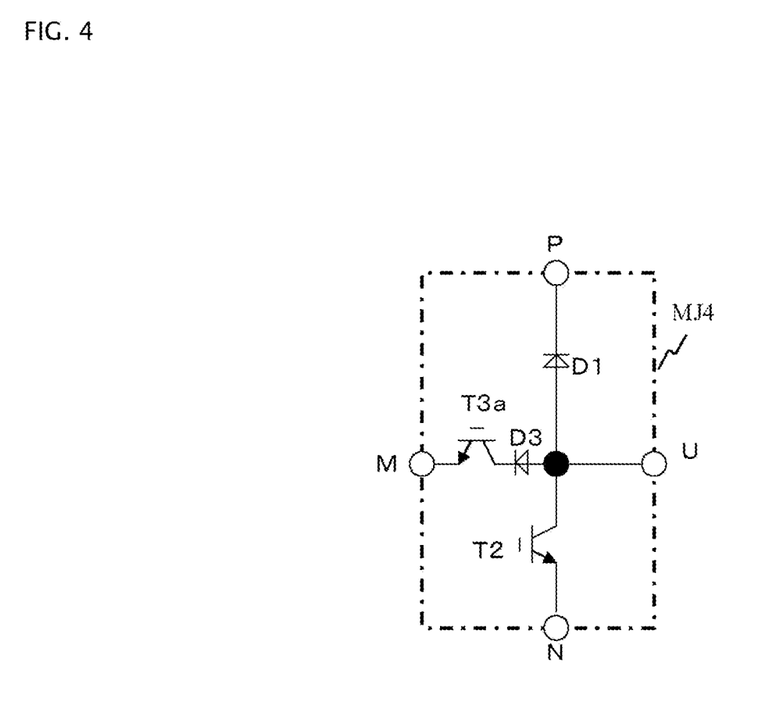
FIG. 4 is a circuit configuration diagram showing a fourth working example of the invention.

FIGS. 3 and 4 show a second working example of the invention. The difference from the first working example is that a series circuit of a diode and an IGBT that does not have reverse blocking voltage is used as the bidirectional switch element connected to the intermediate point potential Cm (Cm1 and Cm2) of the direct current power source.

A module MJ3 shown in FIG. 3 is of a configuration wherein a series circuit of a diode D4 and an IGBT T4a is used instead of the IGBT T4 having reverse blocking voltage of the module 1 in Working Example 1, and a module MJ4 shown in FIG. 4 is of a configuration wherein a series circuit of a diode D3 and an IGBT T3a is used instead of the IGBT T3 having reverse blocking voltage of the module 2. Herein, the series connection order of the diode D4 and IGBT T4a, and the series connection order of the diode D3 and IGBT T3a, may be reversed. Also, the main circuit configuration and action are the same as those of the first working example.

In the working examples, an example is shown of an application to an inverter circuit that creates an alternating current from a direct current, but the same also applies to an application to a converter (PWM rectifier) circuit that creates a direct current from an alternating current.

WORKING EXAMPLE 3

Figure 10:
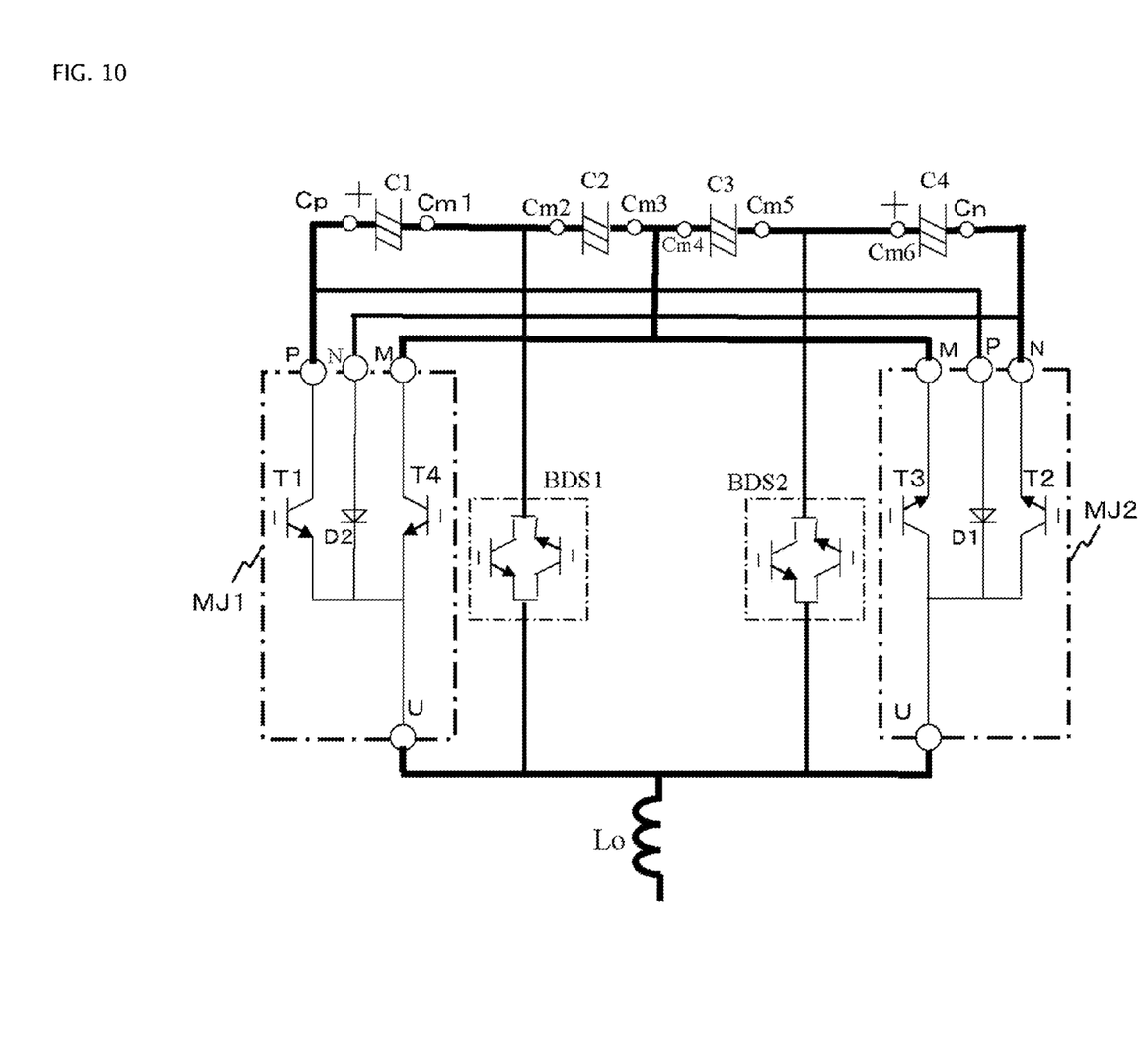
FIG. 10 is a circuit diagram showing an example of an application to a five level inverter circuit.

FIG. 10 shows a third working example of the invention. It is an example of an application to a five level power converter circuit. It is a configuration of one phase of a five level converter wherein capacitors C1 to C4 are connected in series as a direct current power source, five potentials are made with the highest potential at Cp and the lowest potential at Cn, and each potential is supplied to the load side via a reactor Lo in a switch circuit. As it is the three level inverter configuration shown in FIG. 7 made into a five level configuration, it is possible to apply the power semiconductor modules of the invention in the same way as in the three level inverter circuit. It is possible to change the level freely by changing the number of capacitors connected in series and the switch circuit.

In the configuration of FIG. 10, the highest potential Cp, the lowest potential Cn, and intermediate potentials (Cm3 and Cm4) are output to the reactor Lo using the power semiconductor module MJ1 shown in FIG. 1 and the power semiconductor module MJ2 shown in FIG. 2, the second highest potentials (Cm5 and Cm6) are output to the reactor Lo through a bidirectional switch BDS2, and the fourth highest potentials (Cm1 and Cm2) are output to the reactor Lo through a bidirectional switch BDS1. The same effect as with the three level converter circuit is obtained by disposing the modules MJ1 and MJ2 adjacent to each other.

Also, in the same way as with the three level inverter and converter, it is possible to use the modules MJ3 and MJ4 instead of the modules MJ1 and MJ2.

Provided that it is of a configuration wherein a divided direct current power source and a series circuit of two semiconductor switches connected between the direct current power sources are used, and a bidirectional switch is connected between the semiconductor switch series connection point and the direct current power source division point, the invention can be realized with either of a converter or an inverter.

The invention, being a proposal for a power semiconductor module that can be applied to a converter circuit of three levels or more, and for a converter circuit to which the module is applied, can be applied to an uninterruptible power supply system, a motor drive system, a grid connection system, and the like.

This application is based on, and claims priority to, Japanese Patent Application No. 2010-087471, filed on Apr. 6, 2010. The disclosure of the priority application, in its entirety, including the drawings, claims, and the specification thereof, is incorporated herein by reference.

What is claimed is:

1. A power semiconductor module applied to a multi-level converter circuit with three or more levels of voltage waveform, wherein
a first IGBT, a diode whose cathode is connected to the emitter of the first IGBT, and a second IGBT having reverse blocking voltage whose emitter is connected to the emitter of the first IGBT, are housed in one package, and each of the collector of the first IGBT, the collector of the second IGBT, the connection point of the emitter of the first IGBT and the emitter of the second IGBT, and the anode of the diode, is an external terminal.

2. The power semiconductor module according to claim 1, wherein
the collector of the first IGBT is a terminal P connected to the positive electrode of a direct current power source, the collector of the second IGBT is a terminal M connected to an intermediate point of the direct current power source, the connection point of the emitter of the first IGBT and the emitter of the second IGBT is an output terminal U, the anode of the diode is a terminal N connected to the negative electrode of the direct current power source, and the terminal array is disposed in a linear form in the order of the terminal P, the terminal M, the terminal N, and the terminal U.

* * * * *